«12» United States Patent
Sun et al.

«10» Patent No.: US 9,159,818 B2
«45» Date of Patent: Oct. 13, 2015

«54» HIGH-CURRENT N-TYPE SILICON-ON-INSULATOR LATERAL INSULATED-GATE BIPOLAR TRANSISTOR

«71» Applicant: SOUTHEAST UNIVERSITY, Jiangsu (CN)

«72» Inventors: Weifeng Sun, Jiangsu (CN); Siyang Liu, Jiangsu (CN); Jing Zhu, Jiangsu (CN); Qinsong Qian, Jiangsu (CN); Shen Xu, Jiangsu (CN); Shengli Lu, Jiangsu (CN); Longxing Shi, Jiangsu (CN)

«73» Assignee: SOUTHEAST UNIVERSITY, Jiangsu (CN)

«*» Notice: Subject to any disclaimer, the term of this patent is extended or adjusted under 35 U.S.C. 154(b) by 40 days.

«21» Appl. No.: 14/349,632

«22» PCT Filed: Oct. 24, 2012

«86» PCT No.: PCT/CN2012/083427
§ 371 (c)(1),
(2) Date: Apr. 3, 2014

«87» PCT Pub. No.: WO2014/040334
PCT Pub. Date: Mar. 20, 2014

«65» Prior Publication Data
US 2014/0306266 A1    Oct. 16, 2014

«30» Foreign Application Priority Data
Sep. 14, 2012   (CN) .......................... 2012 1 0343012

«51» Int. Cl.
H01L 27/24      (2006.01)
H01L 29/739     (2006.01)
(Continued)

«52» U.S. Cl.
CPC ........ *H01L 29/7394* (2013.01); *H01L 27/1203* (2013.01); *H01L 29/0638* (2013.01); *H01L 29/404* (2013.01); *H01L 27/0623* (2013.01)

«58» Field of Classification Search
CPC .................................... H01L 27/04–27/11898
See application file for complete search history.

«56» References Cited

U.S. PATENT DOCUMENTS 4,386,327 A * 5/1983 Ogawa ...................... 331/108 D
2007/0133257 A1* 6/2007 Kim ............................. 365/149
(Continued)

FOREIGN PATENT DOCUMENTS

CN    101431096 A    5/2009
CN    102097441 A    6/2011
(Continued)

*Primary Examiner* — Matthew W Such
*Assistant Examiner* — Ali Naraghi
«74» *Attorney, Agent, or Firm* — Christensen Fonder P.A.

«57» ABSTRACT

A high-current, N-type silicon-on-insulator lateral insulated-gate bipolar transistor, including: a P-type substrate, a buried-oxide layer disposed on the P-type substrate, an N-type epitaxial layer disposed on the oxide layer, and an N-type buffer trap region. A P-type body region and an N-type central buffer trap region are disposed inside the N-type epitaxial layer; a P-type drain region is disposed in the buffer trap region; N-type source regions and a P-type body contact region are disposed in the P-type body region; an N-type base region and a P-type emitter region are disposed in the buffer trap region; gate and field oxide layers are disposed on the N-type epitaxial layer; polycrystalline silicon gates are disposed on the gate oxide layers; and a passivation layer and metal layers are disposed on the surface of the symmetrical transistor. P-type emitter region output and current density are improved without increasing the area of the transistor.

4 Claims, 4 Drawing Sheets

(51) Int. Cl.
*H01L 29/40* (2006.01)
*H01L 27/12* (2006.01)
*H01L 29/06* (2006.01)
*H01L 27/06* (2006.01)

(56) References Cited

U.S. PATENT DOCUMENTS

2007/0133258 A1* 6/2007 Kim .............................. 365/149
2009/0250759 A1* 10/2009 Otake ........................... 257/356
2013/0256800 A1 10/2013 Qiao et al.

FOREIGN PATENT DOCUMENTS

| CN | 102194818 A | 9/2011 |
| CN | 202076269 U | 12/2011 |

\* cited by examiner

HIGH-CURRENT N-TYPE SILICON-ON-INSULATOR LATERAL INSULATED-GATE BIPOLAR TRANSISTOR

FIELD OF THE INVENTION

The present invention relates to the field of high-voltage power semiconductor devices, in particular to an N-type Silicon-On-Insulator Lateral Insulated-Gate Bipolar Transistor (SOI-LIGBT), which is applicable to high-voltage applications and can increase current density, and be used in driver chips in plasma panel display devices, half-bridge driver circuits, and automobile production fields.

BACKGROUND OF THE INVENTION

As electronic and electric technology develops continuously, power semiconductor devices, which are used as basic electronic components for power control and transformation in electronic and electric systems, have received more and more attention. The technical requirements for improving the performance of power semiconductor devices are mainly embodied in aspects such as integrability, high withstand voltage and high current of the devices, and good isolation from the low-voltage circuit portion. Besides the type of the power semiconductor device, the structure and manufacturing process of a power semiconductor device is also an important influencing factor for high voltage and high current withstand capability of a power integrated circuit.

As the theoretical research and manufacturing technology of power semiconductor devices evolved continuously, insulated gate bipolar transistors (IGBTs) emerged in the 1980s. IGBTs integrate the high current-handling capability of high-voltage triodes and the gate voltage control features of insulated gate field effect transistors (IGFETs), and have advantages such as high input impedance, high switching speed, low driving power, high current driving capability, and low on-resistance, etc. They are almost ideal power semiconductor devices, and have broad development and application prospects.

After the requirements for integrability, high voltage withstand and high current of power semiconductor devices were met, the isolation capability became the top challenge. In that situation, Silicon On Insulator (SOI) technology emerged. With a unique buried insulating layer in SOI, the device is completely isolated from the substrate, the parasitic effect of the silicon device is greatly reduced, and the performance of the device and circuit is significantly improved. A Silicon-On-Insulator Lateral Insulated-Gate Bipolar Transistor (SOI-LIGBT) is a typical SOI-based device, which has advantages including high withstand voltage, high current driving capability, high switching speed, and low power loss, etc. SOI-LIGBTs have gradually become core electronic components for power integrated circuits, and have been widely used in conversion systems with 600V or higher DC voltage, such as AC motors, inverters, switching power supply units, lighting circuits, and traction drive systems, etc.

Compared with longitudinal devices, the current density of SOI-LIGBT devices is usually not high enough. Usually, to solve that problem, the area of the lateral devices is increased to obtain higher current driving capability. However, the increased area is implemented at the cost of consumption of larger chip area, and results in increased cost.

The present invention discloses a high-current N-type SOI-LIGBT, which can attain much higher current density when compared with conventional N-type SOI-LIGBTs that have the same area.

SUMMARY OF THE INVENTION

Embodiments of the present invention employ the following technical solution: a high-current N-type SOI-LIGBT, comprising: a P-type silicon substrate, a buried oxide layer arranged on the P-type silicon substrate, an N-type epitaxial layer arranged on the buried oxide layer, and an N-type central buffer well region arranged in the N-type epitaxial layer. A first N-type base region, a P-type emitter region, and a second N-type base region are arranged sequentially in the N-type central buffer well region, a first portion of base metal is connected to the first N-type base region, a portion of emitter metal is connected to the P-type emitter region, a second portion of base metal is connected to the second N-type base region, a first P-type body region and a second P-type body region are arranged at two sides of the N-type central buffer well region respectively, and the first P-type body region and the second P-type body region are arranged in symmetry to the N-type central buffer well region. A first N-type source region, a first P-type body contact region, and a second N-type source region are arranged sequentially in the first P-type body region. A third N-type source region, a second P-type body contact region, and a fourth N-type source region are arranged sequentially in the second P-type body region. A portion of source metal is connected to the first N-type source region, first P-type body contact region, second N-type source region, third N-type source region, second P-type body contact region, and fourth N-type source region. A first N-type buffer well region is arranged at an outer side of the first P-type body region. A first P-type drain region is arranged in the first N-type buffer well region. A first portion of drain metal is connected to the first P-type drain region and the first base metal, a second N-type buffer well region is arranged at an outer side of the second P-type body region. A second P-type drain region is arranged in the second N-type buffer well region. A second portion of drain metal is connected to the second P-type drain region, and the second base metal, a first gate oxide layer, a first field oxide layer, a second gate oxide layer, a second field oxide layer, a third gate oxide layer, a third field oxide layer, a fourth gate oxide layer, and a fourth field oxide layer are arranged on the surface of the N-type epitaxial layer. One end of the first gate oxide layer abuts one end of the first field oxide layer and is located between the N-type central buffer well region and the first P-type body region. The other end of the first gate oxide layer extends towards the second N-type source region and terminates at the outer boundary of the second N-type source region. The other end of the first field oxide layer extends into the N-type central buffer well region. One end of the second gate oxide layer abuts one end of the second field oxide layer and is located between the N-type central buffer well region and the second P-type body region. The other end of the second gate oxide layer extends towards the third N-type source region and terminates at the outer boundary of the third N-type source region. The other end of the second field oxide layer extends into the N-type central buffer well region. One end of the third gate oxide layer abuts one end of the third field oxide layer and is located between the first P-type body region and the first N-type buffer well region. The other end of the third gate oxide layer extends towards the first N-type source region and terminates at the outer boundary of the first N-type source region. The other end of the third field oxide layer extends towards the first P-type drain region and terminates at the outer boundary of the first P-type drain region. One end of the fourth gate oxide layer butts abuts one end of the fourth field oxide layer and is located between the second P-type body region and the second N-type buffer well region. The other end of the fourth gate oxide layer extends towards the fourth N-type source region and terminates at the outer boundary of the fourth N-type source region. The other end of the fourth field oxide layer extends towards the second P-type drain region and terminates at the outer boundary of the second P-type drain region. A first polysilicon gate is arranged on the first gate oxide layer and extends to the top surface of the first field oxide layer. A second polysilicon gate is arranged on the second gate oxide layer and extends to the top surface of the second field oxide layer. A third polysilicon gate is arranged on the third gate oxide layer and extends to the top surface of the third field oxide layer. A fourth polysilicon gate is arranged on the fourth gate oxide layer and extends to the top surface of the fourth field oxide layer. A portion of gate metal is connected to the first polysilicon gate, second polysilicon gate, third polysilicon gate, and fourth polysilicon gate. A passivation layer is formed on the surface of the third field oxide layer, third polysilicon gate, first N-type source region, first P-type body contact region, second N-type source region, first P-type drain region, first polysilicon gate, first field oxide layer, P-type emitter region, first N-type base region, second N-type base region, second field oxide layer, second polysilicon gate, third N-type source region, second P-type body contact region, fourth N-type source region, fourth polysilicon gate, fourth field oxide layer, and second P-type drain region respectively. An N-type lateral insulated gate bipolar transistor (LIGBT), a PNP-type high-voltage bipolar transistor and a N-type lateral double-diffused metal oxide layer field effect transistor (LDMOSFET) are arranged in the N-type epitaxial layer. A portion of drain metal connected to the drain electrode of the N-type LIGBT is connected via the metal layer to a portion of base metal connected to the base electrode of the PNP-type high-voltage bipolar transistor, and provides output via the emitter metal.

DETAILED DESCRIPTION

Figure 1:
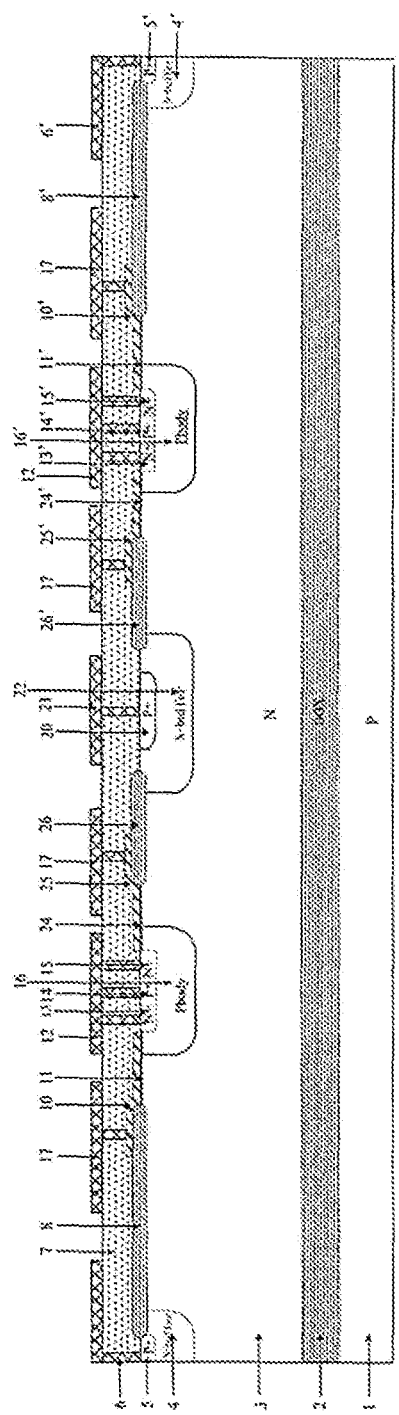
FIG. 1 is a sectional view of the structure of a conventional N-type SOI-LIGBT.
Figure 2:
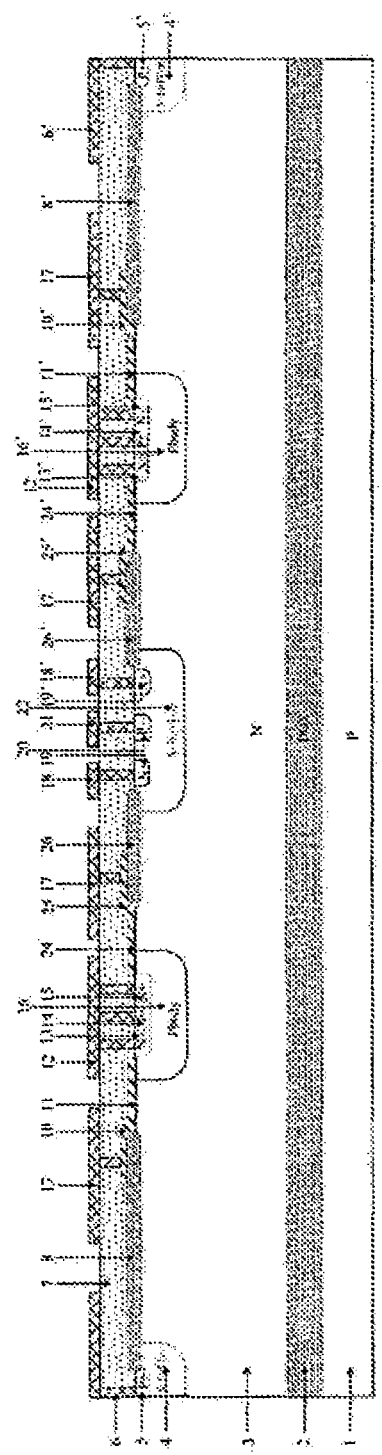
FIG. 2 is a sectional view of the structure of the N-type SOI-LIGBT according to an embodiment of the invention.
Figure 3:
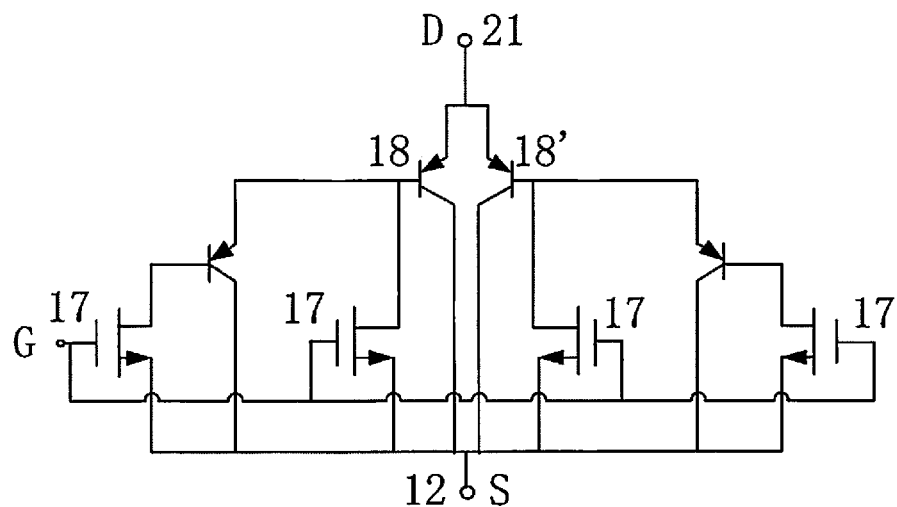
FIG. 3 is an equivalent circuit diagram of the N-type SOI-LIGBT of FIG. 2.
Figure 4:
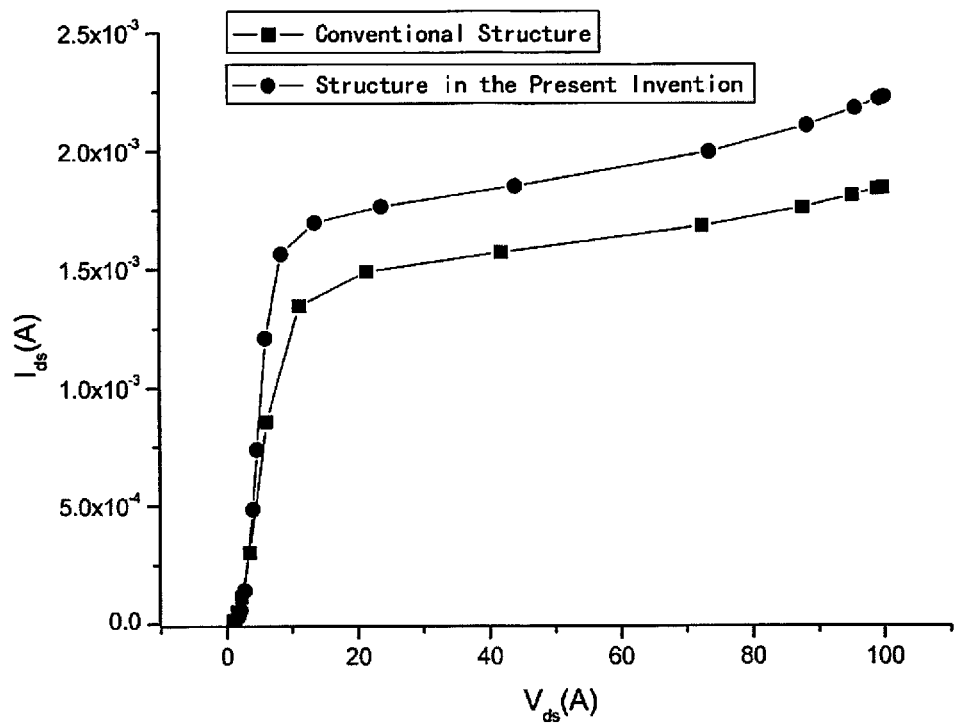
FIG. 4 shows the comparison of drain current density between an N-type SOI-LIGBT of the invention and a conventional N-type SOI-IGBT with the same area.

Compared with the prior art, as depicted in FIG. 1, embodiments of the invention have the following advantages:

(1) The transistors in the invention may be arranged in a symmetric structure, including a first N-type LIGBT, a first N-type LDMOSFET, a first PNP-type high-voltage bipolar transistor, a second PNP-type high-voltage bipolar transistor, a second N-type LDMOSFET, and a second N-type LIGBT, which are arranged in symmetry in a left-right direction, wherein, the source regions of the first N-type LIGBT, first N-type LDMOSFET, second N-type LDMOSFET, and second N-type LIGBT are connected with the collector regions of the first PNP-type high-voltage bipolar transistor and second PNP-type high-voltage bipolar transistor via the metal layer. The drain electrode of the first N-type LIGBT is connected with the base electrode of the first PNP-type high-voltage bipolar transistor via the metal layer. The drain electrode of the second N-type LIGBT is connected with the base electrode of the second PNP-type high-voltage bipolar transistor, and the emitter electrodes of the first PNP-type high-voltage bipolar transistor and second PNP-type high-voltage bipolar transistor are used as the output electrodes. The structure of the transistors is shown in FIG. 2. With such a structure, the drain current of the first N-type LIGBT and the drain current of the first N-type LDMOSFET are converged as the base current of the first PNP-type high-voltage bipolar transistor. The drain current of the second N-type LIGBT and the drain current of the second N-type LDMOSFET are converged as the base current of the second PNP-type high-voltage bipolar transistor; with the amplification effect of the PNP-type high-voltage bipolar transistors, the current outputted from the emitter electrodes of the PNP-type high-voltage bipolar transistors amplifies the base current, therefore, the current density of the entire device is increased. An equivalent circuit diagram of the transistors is shown in FIG. 3. FIG. 4 shows the comparison of current density between the N-type SOI-LIGBT of the present invention and a conventional N-type IGBT with the same area. It can be seen from the diagram: the current density in the N-type SOI-LIGBT of the present invention is 25% higher than the current density in the conventional N-type IGBT.

(2) Compared with conventional devices, the device of the present invention improves current density but does not increase the original layout area.

Figure 5:
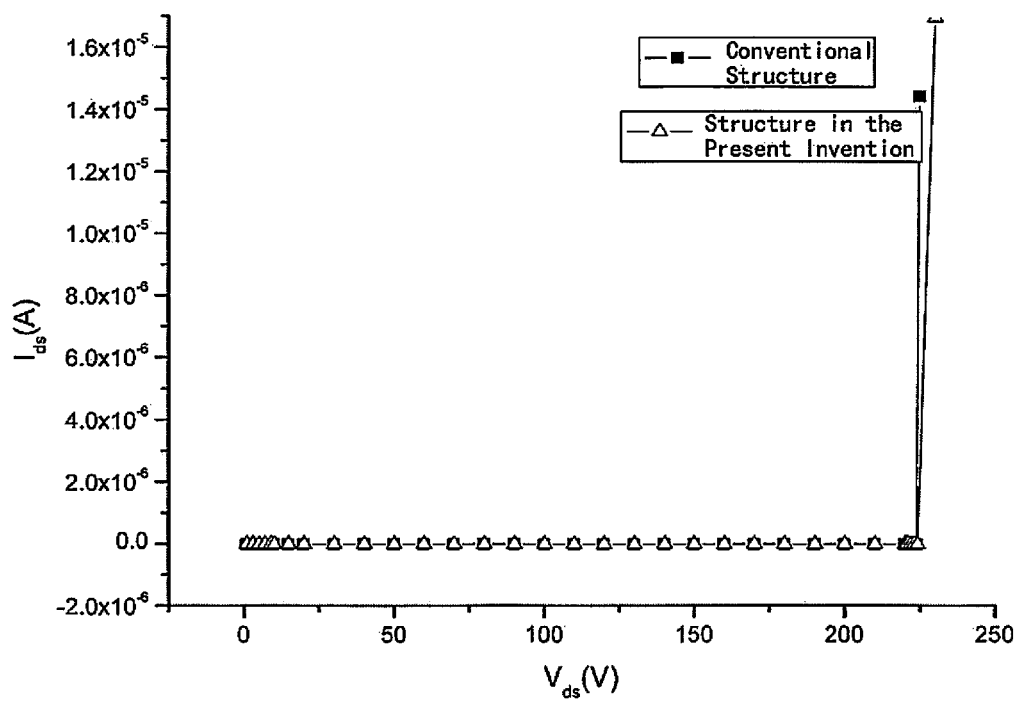
FIG. 5 shows the comparison of reverse breakdown voltage in an OFF state between an N-type SOI-LIGBT of the invention and a conventional N-type SOI-IGBT.

(3) Devices of the present invention have no impact on the withstand voltage rating while increasing the current density. The basic properties of the device still meet the requirements. FIG. 5 shows the comparison of breakdown voltage in an OFF state between an N-type SOI-LIGBT of the invention and a conventional N-type IGBT with the same area. It can be seen from the diagram: the breakdown voltage in the OFF state of the N-type SOI-LIGBT of the invention matches that of the conventional IGBT having the same area.

(4) The device of the invention may be manufactured through a SOI process and does not require any additional manufacturing procedure, which is to say, the manufacturing process of the device in the present invention is fully compatible with existing CMOS manufacturing processes.

Referring again to FIG. 2, an embodiment of a high-current N-type SOI-LIGBT, comprises: a P-type substrate 1, a buried oxide layer 2 arranged on the P-type substrate 1, a N-type epitaxial layer 3 arranged on the buried oxide layer 2, and a N-type central buffer well region 22 arranged in the N-type epitaxial layer 3. A first N-type base region 19, a P-type emitter region 20, and a second N-type base region 19' are arranged sequentially in the N-type central buffer well region 22; a first portion of base metal 18 is connected to the first N-type base region 19. A portion of emitter metal 21 is connected to the P-type emitter region 20. A second portion of base metal 18' is connected to the second N-type base region 19'. A first P-type body region 16 and a second P-type body region 16' are arranged at two sides of the N-type central buffer well region 22 respectively, and the first P-type body region 16 and the second P-type body 16' region are arranged in symmetry to the N-type central buffer well region 22. A first N-type source region 13, a first P-type body contact region 14, and a second N-type source region 15 are arranged sequentially in the first P-type body region 16. A third N-type source region 13', a second P-type body contact region 14', and a fourth N-type source region 15' are arranged sequentially in the second P-type body region 16'. A portion of source metal 12 is connected to the first N-type source region 13, first P-type body contact region 14, second N-type source region 15, third N-type source region 13', second P-type body contact region 14', and fourth N-type source region 15'. A first N-type buffer well region 4 is arranged at an outer side of the first P-type body region 16. A first P-type drain region 5 is arranged in the first N-type buffer well region 4. A first portion of drain metal 6 is connected to the first P-type drain region 5 and the first base metal 18. A second N-type buffer well region 4' is arranged at an outer side of the second P-type body region 16'. A second P-type drain region 5' is arranged in the second N-type buffer well region 4'. A second portion of drain metal 6' is connected to the second P-type drain region 5' and the second base metal 18'. A first gate oxide layer 24, a first field oxide layer 26, a second gate oxide layer 24', a second field oxide layer 26', a third gate oxide layer 11, a third field oxide layer 8, a fourth gate oxide layer 11', and a fourth field oxide layer 8' are arranged on the surface of the N-type epitaxial layer 3, wherein, one end of the first gate oxide layer 24 abuts one end of the first field oxide layer 26 and is located between the N-type central buffer well region 22 and the first P-type body region 16. The other end of the first gate oxide layer 24 extends towards the second N-type source region 15 and terminates at the outer boundary of the second N-type source region 15. The other end of the first field oxide layer 26 extends into the N-type central buffer well region 22. One end of the second gate oxide layer 24' abuts one end of the second field oxide layer 26' and is located between the N-type central buffer well region 22 and the second P-type body region 16'. The other end of the second gate oxide layer 24' extends towards the third N-type source region 13' and terminates at the outer boundary of the third N-type source region 13'. The other end of the second field oxide layer 26' extends into the N-type central buffer well region 22. One end of the third gate oxide layer 11 abuts one end of the third field oxide layer 8 and is located between the first P-type body region 16 and the first N-type buffer well region 4. The other end of the third gate oxide layer 11 extends towards the first N-type source region 13 and terminates at the outer boundary of the first N-type source region 13. The other end of the third field oxide layer 8 extends towards the first P-type drain region 5 and terminates at the outer boundary of the first P-type drain region 5. One end of the fourth gate oxide layer 11' abuts one end of the fourth field oxide layer 8' and is located between the second P-type body region 16' and the second N-type buffer well region 4'. The other end of the fourth gate oxide layer 11' extends towards the fourth N-type source region 15' and terminates at the outer boundary of the fourth N-type source region 15'. The other end of the fourth field oxide layer 8' extends towards the second P-type drain region 5' and terminates at the outer boundary of the second P-type drain region 5'. A first polysilicon gate 25 is arranged on the first gate oxide layer 24 and extends to the top surface of the first field oxide layer 26. A second polysilicon gate 25' is arranged on the second gate oxide layer 24' and extends to the top surface of the second field oxide layer 26'. A third polysilicon gate 10 is arranged on the third gate oxide layer 11 and extends to the top surface of the third field oxide layer 8. A fourth polysilicon gate 10' is arranged on the fourth gate oxide layer 11' and extends to the top surface of the fourth field oxide layer 8'. A portion of gate metal 17 is connected to the first polysilicon gate 25, second polysilicon gate 25', third polysilicon gate 10, and fourth polysilicon gate 10'. A passivation layer 7 is formed on the surface of the third field oxide layer 8, third polysilicon gate 10, first N-type source region 13, first P-type body contact region 14, second N-type source region 15, first P-type drain region 5, first polysilicon gate 25, first field oxide layer 26, P-type emitter region 20, first N-type base region 19, second N-type base region 19', second field oxide layer 26', second polysilicon gate 25', third N-type source region 13', second P-type body contact region 14', fourth N-type source region 15', fourth polysilicon gate 10', fourth field oxide layer 8', and second P-type drain region 5' respectively.

The spacing between the P-type emitter region 20 of the N-type SOI-LIGBT and each of the first N-type base region 19 and the second N-type base region 19' is 1 μm~2 μm. The spacing between the first N-type base region 19 and the left edge of the N-type central buffer well region 22 is 1 μm~2 μm, and the spacing between the second N-type base region 19' and the right edge of the N-type central buffer well region 22 is 1 μm~2 μm.

The device in an embodiment of the invention is produced with the following method:

First, produce a SOI layer on a P-type substrate, and produce an N-type epitaxial layer 3 on the SOI layer; then, produce transistors, including: forming first N-type buffer well region 4, second N-type buffer well region 4', and N-type central buffer well region 22 by implanting high-energy phosphorus ions into the N-type epitaxial layer 3 and annealing at high temperature; form first P-type body region 16 and second P-type body region 16' by implanting high-energy boron ions, and annealing at high temperature; and grow first field oxide layer 26, second field oxide layer 26', third field oxide layer 8, and fourth field oxide layer 8' at a high temperature; next, grow third gate oxide layer 11, first gate oxide layer 24, second gate oxide layer 24', and fourth gate oxide layer 11'; then, deposit third polysilicon gate 10, first polysilicon gate 25, second polysilicon gate 25', and fourth polysilicon gate 10'; etch the polysilicon gates; produce heavily doped first P-type drain region 5, first N-type source region 13, first P-type body contact region 14, second N-type source region 15, first N-type base region 19, P-type emitter region 20, second N-type base region 19', third N-type source region 13', second P-type body contact region 14', fourth N-type source region 15', and second P-type drain region 5; deposit silicon dioxide; etch electrode contact regions and then deposit a metal material; next, etch the metal material and lead out the electrodes; finally, carry out passivating treatment.

The invention claimed is:
1. A high-current N-type SOI-LIGBT, comprising:
   a P-type silicon substrate;
   a buried oxide layer arranged on the P-type silicon substrate;
   an N-type epitaxial layer arranged on the buried oxide layer;
   an N-type central buffer well region arranged in the N-type epitaxial layer;
   a P-type emitter region arranged in the N-type central buffer well region; and a portion of emitter metal connected to the P-type emitter region;
   wherein:
   a first N-type base region and a second N-type base region are arranged in the N-type central buffer well region, and the first N-type base region and the second N-type base region are at two sides of the P-type emitter region and in symmetry to the P-type emitter region;
   a first piece portion of base metal is connected to the first N-type base region, a second piece portion of base metal is connected to the second N-type base region, a first P-type body region and a second P-type body region are arranged at two sides of the N-type central buffer well region respectively, and the first P-type body region and the second P-type body region are arranged in symmetry to the N-type central buffer well region;

a first N-type source region, a first P-type body contact region, and a second N-type source region are arranged sequentially in the first P-type body region;
a third N-type source region, a second P-type body contact region, and a fourth N-type source region are arranged sequentially in the second P-type body region;
a portion of source metal is connected to the first N-type source region, first P-type body contact region, second N-type source region, third N-type source region, second P-type body contact region, and fourth N-type source region;
a first N-type buffer well region is arranged at an outer side of the first P-type body region;
a first P-type drain region is arranged in the first N-type buffer well region;
a first piece portion of drain metal is connected to the first P-type drain region and the first base metal;
a second N-type buffer well region is arranged at an outer side of the second P-type body region;
a second P-type drain region is arranged in the second N-type buffer well region;
a second piece of drain metal is connected to the second P-type drain region and the second base metal;
the first N-type buffer well region and the second N-type buffer well region are in symmetry to the N-type central buffer well region;
a first gate oxide layer, a first field oxide layer, a second gate oxide layer, a second field oxide layer, a third gate oxide layer, a third field oxide layer, a fourth gate oxide layer, and a fourth field oxide layer are arranged on the surface of the N-type epitaxial layer; and
wherein:
one end of the first gate oxide layer abuts one end of the first field oxide layer and is located between the N-type central buffer well region and the first P-type body region;
another end of the first gate oxide layer extends towards the second N-type source region and terminates at the outer boundary of the second N-type source region;
another end of the first field oxide layer extends into the N-type central buffer well region;
one end of the second gate oxide layer abuts one end of the second field oxide layer and is located between the N-type central buffer well region and the second P-type body region;
another end of the second gate oxide layer extends towards the third N-type source region and terminates at the outer boundary of the third N-type source region;
another end of the second field oxide layer extends into the N-type central buffer well region; one end of the third gate oxide layer abuts one end of the third field oxide layer and is located between the first P-type body region and the first N-type buffer well region;
another end of the third gate oxide layer extends towards the first N-type source region and terminates at an outer boundary of the first N-type source region;
another end of the third field oxide layer extends towards the first P-type drain region and terminates at an outer boundary of the first P-type drain region;
one end of the fourth gate oxide layer abuts one end of the fourth field oxide layer and is located between the second P-type body region and the second N-type buffer well region;
the other end of the fourth gate oxide layer extends towards the fourth N-type source region and terminates at an outer boundary of the fourth N-type source region;
another end of the fourth field oxide layer extends towards the second P-type drain region and terminates at an outer boundary of the second P-type drain region;
a first polysilicon gate is arranged on the first gate oxide layer and extends to a top surface of the first field oxide layer;
a second polysilicon gate is arranged on the second gate oxide layer and extends to the top surface of the second field oxide layer;
a third polysilicon gate is arranged on the third gate oxide layer and extends to a top surface of the third field oxide layer;
a fourth polysilicon gate is arranged on the fourth gate oxide layer and extends to a top surface of the fourth field oxide layer;
a portion of gate metal is connected to the first polysilicon gate, second polysilicon gate, third polysilicon gate, and fourth polysilicon gate; and
a passivation layer is formed on a surface of the third field oxide layer, third polysilicon gate, first N-type source region, first P-type body contact region, second N-type source region, first P-type drain region, first polysilicon gate, first field oxide layer, P-type emitter region, first N-type base region, second N-type base region, second field oxide layer, second polysilicon gate, third N-type source region, second P-type body contact region, fourth N-type source region, fourth polysilicon gate, fourth field oxide layer, and second P-type drain region, respectively.

2. The high-current N-type SOI-LIGBT according to claim 1, wherein the transistors of the SOI-LIGBT are arranged in a symmetric structure, and comprise:
a first N-type LIGBT;
a first N-type LDMOSFET;
a first PNP-type high-voltage bipolar transistor;
a second PNP-type high-voltage bipolar transistor;
a second N-type LDMOSFET;
and a second N-type LIGBT;
wherein:
the first N-type LIGBT and the second N-type LIGBT are located at two sides of the N-type central buffer well region and are in symmetry to the N-type central buffer well region;
the drain region of the first N-type LIGBT employs the first P-type drain region, and the source region employs the first N-type source region;
the drain region of the second N-type LIGBT employs the second P-type drain region, and the source region employs the fourth N-type source region;
the first N-type LDMOSFET and the second N-type LDMOSFET are located at two sides of the P-type emitter region and are in symmetry to the P-type emitter region;
the drain region of the first N-type LDMOSFET employs the first N-type base region, and the source region employs the second N-type source region;
the drain region of the second N-type LDMOSFET employs the second N-type base region, and the source region employs the third N-type source region;
the emitter region of the first PNP-type high-voltage bipolar transistor employs the P-type emitter region, the base region employs the first N-type base region, and the collector region employs the first P-type body contact region;
the first P-type body contact region serves as a body contact region for both the first N-type LIGBT and the first N-type LDMOSFET;

the emitter region of the second PNP-type high-voltage bipolar transistor employs the P-type emitter region, the base region employs the second N-type base region, and the collector region employs the second P-type body contact region;

the second P-type body contact region serves as a body contact region for both the second N-type LDMOSFET and the second N-type LIGBT;

the gate electrodes of the first N-type LIGBT, first N-type LDMOSFET, second N-type LDMOSFET, and second N-type LIGBT are led out by means of a portion of gate metal;

the first drain metal of the first N-type LIGBT is connected with the first base metal of the first PNP-type high-voltage bipolar transistor via the metal layer;

the second drain metal of the second N-type LIGBT is connected with the second base metal of the second PNP-type high-voltage bipolar transistor via the metal layer; and output is provided via the emitter metal.

3. The high-current N-type SOI-LIGBT according to claim 1, wherein, the spacing between the P-type emitter region and each of the first N-type base region and second N-type base region ranges from 1 um to 2 um the spacing between the first N-type base region and the left edge of the N-type central buffer well region is ranges from 1 um to 2 um; and the spacing between the second N-type base region and the right edge of the N-type central buffer well region ranges from 1 um to 2 um.

4. The high-current N-type SOI-LIGBT according to claim 2, wherein, the spacing between the P-type emitter region and each of the first N-type base region and second N-type base region ranges from 1 μm to 2 μm; the spacing between the first N-type base region and the left edge of the N-type central buffer well region ranges from 1 μm to 2 μm; and the spacing between the second N-type base region and the right edge of the N-type central buffer well region ranges from 1 μm to 2 μm.

* * * * *